(12) United States Patent
Itoga et al.

(10) Patent No.: US 12,501,834 B2
(45) Date of Patent: Dec. 16, 2025

(54) SEMICONDUCTOR DEVICE

(71) Applicant: Japan Display Inc., Tokyo (JP)

(72) Inventors: Toshihiko Itoga, Tokyo (JP); Takuo Kaitoh, Tokyo (JP)

(73) Assignee: Japan Display Inc., Tokyo (JP)

( * ) Notice: Subject to any disclaimer, the term of this patent is extended or adjusted under 35 U.S.C. 154(b) by 932 days.

(21) Appl. No.: 17/657,266

(22) Filed: Mar. 30, 2022

(65) Prior Publication Data
US 2022/0223782 A1 Jul. 14, 2022

Related U.S. Application Data

(63) Continuation of application No. PCT/JP2020/035085, filed on Sep. 16, 2020.

(30) Foreign Application Priority Data

Oct. 4, 2019 (JP) ................... 2019-183863

(51) Int. Cl.
*H01L 41/187* (2006.01)
*H10N 30/80* (2023.01)
(Continued)

(52) U.S. Cl.
CPC ........... *H10N 39/00* (2023.02); *H10N 30/802* (2023.02); *H10N 30/8554* (2023.02); *H10N 30/874* (2023.02); *H10K 59/00* (2023.02)

(58) Field of Classification Search
CPC .. H10N 39/00; H10N 30/802; H10N 30/8554; H10N 30/874; H10N 30/302;
(Continued)

(56) References Cited

U.S. PATENT DOCUMENTS

2014/0362000 A1* 12/2014 Seo ..................... G06F 3/04144
29/25.35
2015/0194591 A1 7/2015 Fujii
(Continued)

FOREIGN PATENT DOCUMENTS

WO WO 2014/045914 A1 3/2014

OTHER PUBLICATIONS

International Search Report issued Dec. 8, 2020 in PCT/JP2020/035085 filed Sep. 16, 2020, 2 pages.

*Primary Examiner* — Jarrett J Stark
(74) *Attorney, Agent, or Firm* — Maier & Maier, PLLC

(57) ABSTRACT

The purpose of the present invention is to form a semiconductor device in which an active area laminated on a PZT (lead zirconate titanate (PbZrTiO₃) sensor having a piezoelectric effect. The main structure of the present invention is as follows. A semiconductor device having a PZT (lead zirconate titanate (PbZrTiO₃)) sensor including: the PZT sensor including a lower electrode formed on a glass substrate, a PZT, an upper electrode, a first inorganic insulating film covering the upper electrode, and an upper wiring formed on the first inorganic insulating film and connected to the upper electrode through a first through-hole formed in the first inorganic insulating film; in which a polyimide film is formed over the PZT sensor; a plurality of TFTs are formed on the polyimide film, and a thickness of the polyimide film is 5 μm or more.

8 Claims, 10 Drawing Sheets

(51) Int. Cl.
   *H10N 30/853*   (2023.01)
   *H10N 30/87*    (2023.01)
   *H10N 39/00*    (2023.01)
   *H10K 59/00*    (2023.01)

(58) Field of Classification Search
   CPC ..... H10K 59/00; G02F 1/1333; G02F 1/1368; G06F 3/041; G06F 3/043; G09F 9/30; H05B 33/02
   See application file for complete search history.

(56) References Cited

U.S. PATENT DOCUMENTS

| | | | |
|---|---|---|---|
| 2016/0064425 A1* | 3/2016 | Kim | H10D 30/6746 |
| | | | 438/151 |
| 2016/0064460 A1* | 3/2016 | Kim | H10F 77/413 |
| | | | 257/40 |
| 2017/0077202 A1* | 3/2017 | Ha | H10D 30/0321 |
| 2017/0256594 A1* | 9/2017 | Bae | H10K 50/8426 |
| 2017/0271381 A1* | 9/2017 | Sone | H10D 30/6755 |
| 2018/0137325 A1* | 5/2018 | Mainguet | H10N 15/10 |
| 2018/0224990 A1* | 8/2018 | Shim | G06F 3/0412 |
| 2018/0232089 A1* | 8/2018 | Ozawa | G06F 3/0443 |
| 2019/0013378 A1* | 1/2019 | Wang | H10K 59/126 |
| 2019/0210867 A1* | 7/2019 | Zhao | H10N 30/067 |
| 2020/0083311 A1* | 3/2020 | Cha | H10K 59/80522 |
| 2021/0202676 A1* | 7/2021 | Jeong | H10K 59/10 |
| 2022/0223782 A1* | 7/2022 | Itoga | H10N 30/8554 |

\* cited by examiner

C-C

| Process Flow | |
|---|---|
| 1 | M1 sputtering |
| 2 | M1/PEP |
| 3 | M1 dry etching |
| 4 | PZT formation |
| 5 | PZT/PEP |
| 6 | PZT etching(dry or wet) |
| 7 | M2 sputtering |
| 8 | M2/PEP |
| 9 | M2 etching(dry or wet) |
| 10 | Insulating film formation(CVD) |
| 11 | CONT/PEP |
| 12 | Insulating film dry etching |
| 13 | M3 sputtering |
| 14 | M3/PEP |
| 15 | M3 etching(dry or wet) |
| 16 | PI formation |
| 17 | Barrir formation |

SEMICONDUCTOR DEVICE

The present application is a continuation application of International Application No. PCT/JP2020/035085, filed on Sep. 16, 2020, which claims priority to Japanese Patent Application No. 2019-183863, filed on Oct. 4, 2019. The contents of these applications are incorporated herein by reference in their entirety.

BACKGROUND OF THE INVENTION

(1) Field of the Invention

The present invention relates to a semiconductor device having a sensor using a ferroelectric thin film as a piezoelectric element or a pyroelectric element.

(2) Description of the Related Art

Devices using ferroelectrics as microsensors and microactuators have been developed. Examples of such a device include a pressure sensor, an acceleration sensor, a gyro sensor, and an ink jet thin film head.

Among ferroelectrics, lead zirconate titanate ($PbZrTiO_3$, hereinafter referred to as PZT) has excellent piezoelectric characteristics. Patent Document 1 describes a structure of a piezoelectric device having PZT which eliminates polarization processing which uses a high voltage, and prevents polarization deterioration due to usage environment, and a method of manufacturing the same.

PRIOR ART REFERENCE

Patent Document

[Patent document 1] WO 2014-045914

SUMMARY OF THE INVENTION

Rather than using a ferroelectric as a single actuator or a single sensor, there is a demand to use those actuators or sensors incorporating into, for example, a display panel. In an organic EL display device, a liquid crystal display device, or the like, a region where a pixel is formed needs to be flat. However, a sensor using a ferroelectric such as PZT is required to have a certain thickness. When such a sensor and a pixel forming region are stacked, unevenness occurs between a portion where the sensor is present and a portion where the sensor is not present.

In addition, there is a case in which the sensor is not formed on the entire surface of the display region but formed only on a portion of the display region. In this case, there is a possibility that uneven luminance or uneven color may occur between the region where the sensor is formed and the other region. The same applies to the case where a ferroelectric actuator is used as well as a sensor.

Such uneven luminance and uneven color are not limited to the organic EL display device and the liquid crystal display device, and the same applies to other display devices. Further, there is a possibility that regional uneven performance may occur in the semiconductor device, in addition to the display devices, when a sensor or an actuator is formed in a stacked manner with the functional area.

It is an object of the present invention to provide a semiconductor device, such as a display device, in which occurrence of unevenness in the function in each region is suppressed when a sensor or an actuator of ferroelectric is used in stacked with a functional region The present invention solves the above problems, and the main specific means thereof are as follows.

(1) A semiconductor device having a PZT (lead zirconate titanate ($PbZrTiO_3$) sensor including: the PZT sensor including a lower electrode formed on a glass substrate, a PZT, an upper electrode, a first inorganic insulating film covering the upper electrode, and an upper wiring formed on the first inorganic insulating film and connected to the upper electrode through a first through-hole formed in the first inorganic insulating film; in which a polyimide film is formed over the PZT sensor; a plurality of TFTs are formed on the polyimide film, and a thickness of the polyimide film is 5 μm or more.

(2) A semiconductor device having a PZT (lead zirconate titanate ($PbZrTiO_3$) sensor including: the PZT sensor including a lower electrode formed on a first polyimide substrate, a PZT, an upper electrode, a first inorganic insulating film covering the upper electrode, and an upper wiring formed on the first inorganic insulating film and connected to the upper electrode through a first through-hole formed in the first inorganic insulating film; in which a second polyimide film is formed over the PZT sensor: a plurality of TFTs are formed on the polyimide film, and a thickness of the second polyimide film is 5 μm or more.

(3) A semiconductor device having a PZT (lead zirconate titanate ($PbZrTiO_3$) sensor including: the PZT sensor including a lower electrode formed on a first inorganic insulating film, which covers a polyimide film, a PZT, an upper electrode, a second inorganic insulating film covering the upper electrode, an upper wiring, formed on the second inorganic insulating film, contacting with the upper electrode via a first through hole formed in the second inorganic insulating film; in which a second polyimide film is formed on the PZT sensor, a plurality of TFTs are formed on the second polyimide film, and a thickness of the second polyimide film is 5 μm or more.

DETAILED DESCRIPTION OF THE PREFERRED EMBODIMENTS

The contents of the present invention are described using an embodiment below. In an embodiment, a sensor using a PZT or an actuator using PZT will be described. Further, in the following embodiments, a configuration in which a PZT sensor is laminated in an organic EL display device is described, but this configuration can be similarly applied to other display devices such as a liquid crystal display device or other semiconductor devices.

Embodiment 1

Figure 1:
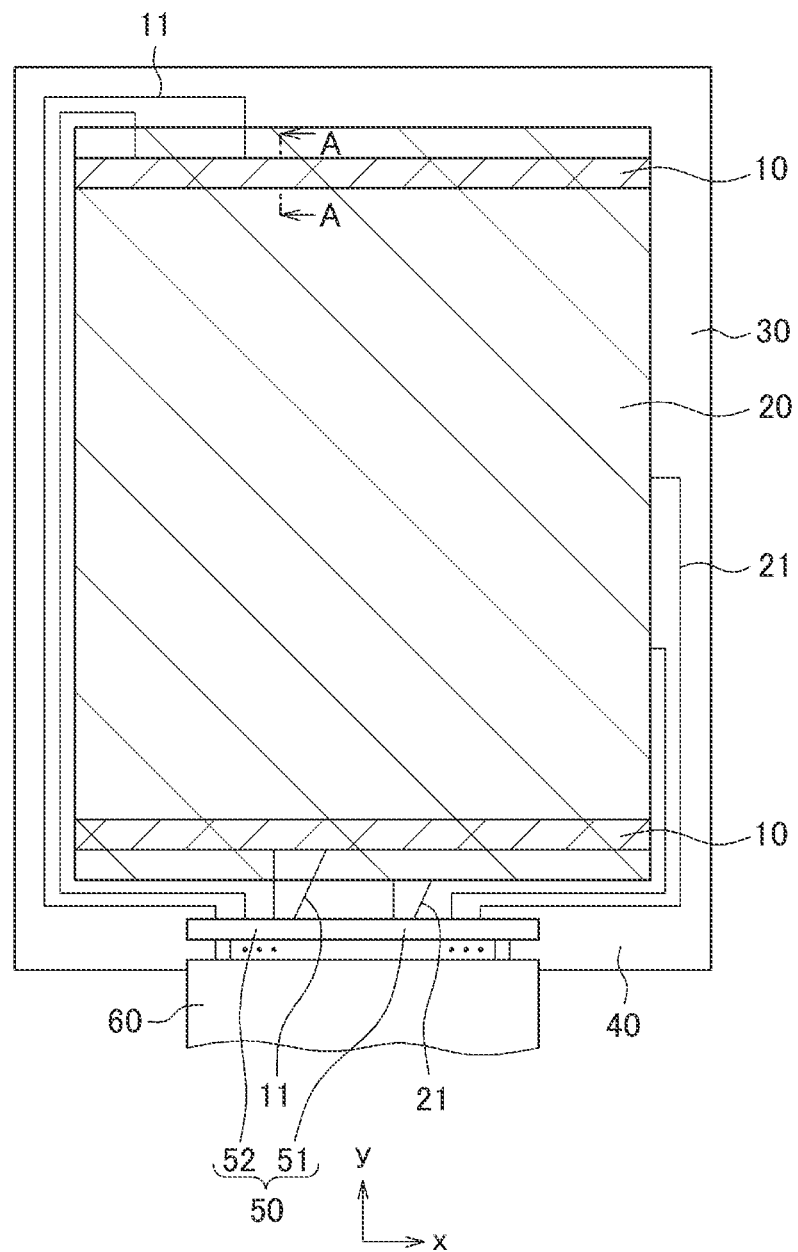
FIG. 1 is a plan view of an organic EL display device having a PZT sensor.

FIG. 1 is a plan view showing an example of an organic EL display device to which the present invention is applied. In FIG. 1, a peripheral region 30 in which lead lines 21 from a scanning line, a video signal line, a power supply line, or the like are provided is formed around a display region 20 in which a pixel, a video signal line, a scanning line, a power supply line, and the like are formed. In the peripheral region 30, a scanning line driving circuit or the like may be formed.

On the upper and lower sides of the display region 20 in the y direction, a so-called HAPTIC sensor 10 composed of a one dimensional array of PZT sensors is formed in a band shape in the x-direction. HAPTIC sensor 10 in this case can be used to detect a touch position, for example, when a person touches anywhere in the display area 20.

That is, a predetermined vibration is generated from an individual PZT sensor, and this vibration is detected by another PZT sensor. Then, for example, when a person touches a screen, the vibration sent from the PZT sensor is changed, so that this variation is detected by the other PZT sensor and the touch position is determined. In this case, a PZT sensor for generating vibration and a PZT sensor for sensing are separately arranged, or a time sharing system may be employed in which the same PZT sensor is used for vibration generation for a predetermined time, and another time is used as a sensor for detection.

While the HAPTIC sensor 10 in FIG. 1 is located slightly inwardly from the upper and lower ends of the display region 20, the location is not limited thereto and may be located at any location where the sensor is easy to operate. Further, the HAPTIC sensor 10 may be formed in a belt-like shape extending in the y direction. Further, it may be formed in the peripheral region 30 rather than in the display region 20. A terminal region 40 is present in the lower side in the y-direction of FIG. 1, and a driver IC 50 is mounted in the terminal region 40. For example, a circuit for driving the PZT sensor is formed on the left side 52 of the driver IC 50, and a circuit for driving the display region 20 of the organic EL display panel is formed on the right side 51 of the driver IC 50. Further, a flexible wiring board 60 is connected to the terminal region 40 so as to supply a power source and a signal to the HAPTIC sensor 10 and the organic EL display device. By the way, in order to reduce an area of the terminal region 40, the driver IC 50 may be mounted on the flexible wiring substrate 60.

Figure 2:
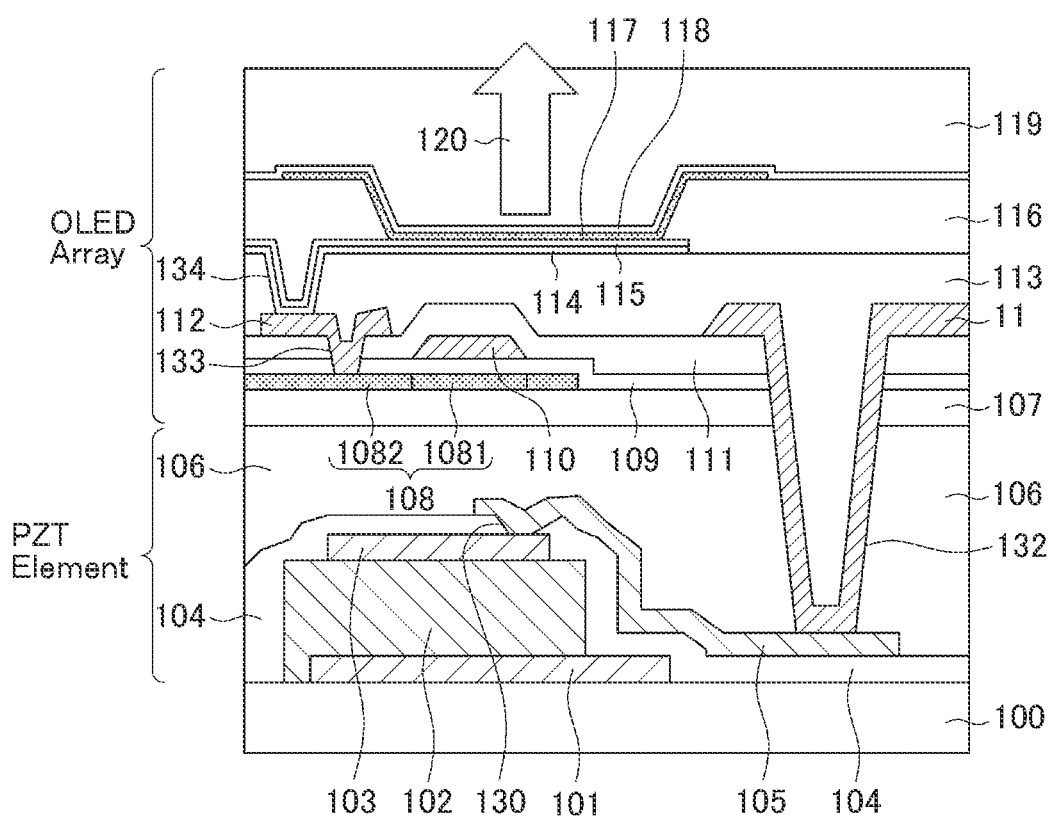
FIG. 2 is a cross sectional view of the display area in which a PZT sensor is formed.

FIG. 2 is a cross-sectional view taken along line A-A of FIG. 1 and is a cross-sectional view of a region in which a PZT sensor is present. The PZT sensor is a sensor utilizing a piezoelectric effect by PZT or a pyroelectric effect (inverse piezoelectric effect). In FIG. 2, a lower electrode 101 for forming a sensor is formed on a substrate 100. The substrate 100 is formed of non-alkali glass, and has a thickness of, for example, 0.5 mm. When heat resistance of 550° C. or higher is required for the substrate 110, a silicon substrate or the like can be used, but in this case, it is difficult to secure a large substrate area. In other words, in an organic EL display device, a plurality of display panels are formed on a large mother substrate, and therefore, it is desirable to configure the PZT sensor by a process such that a glass substrate can be used.

In FIG. 2, the lower electrode 101 is formed of a laminated film of titanium (Ti) and platinum (Pt). The titanium film is on the side of the substrate 100, and the platinum film is on the side in contact with the PZT film 102. Platinum is used as an upper layer of the lower electrode 101 to facilitate crystallization of the PZT film 102. A total thickness of the lower electrode 101 is several hundreds of nanometers, but is thinner than 500 nm.

A PZT film 102 having piezoelectric characteristics is formed on the lower electrode 101. The PZT film 102 has a thickness of, for example, about 2 to 3 μm. PZT film 102 may be formed by RF magnetron sputtering, for example.

An upper electrode 103 is formed on the PZT film 102. The upper electrode 103 is formed of, for example, titanium (Ti), tungsten (W), or molybdenum tungsten alloy (MoW), and has a thickness of several hundreds of nanometers, but is thinner than 500 nm. The upper electrode 103 is formed with an area slightly smaller than that of the PZT film 102 or the lower electrode 101.

Figure 4:
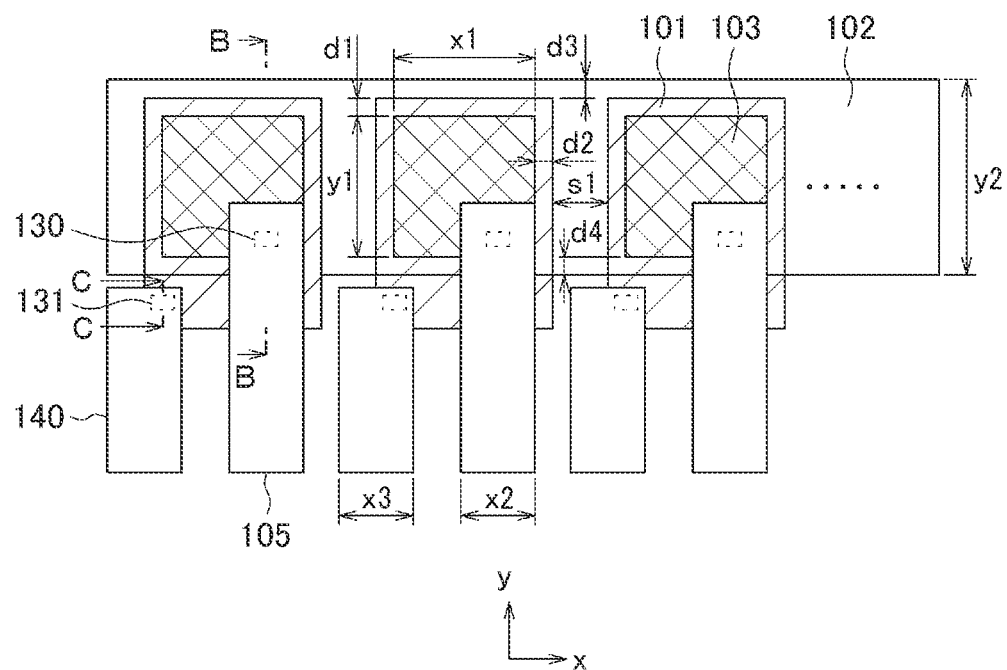
FIG. 4 is a plan view of HAPTIC sensor (PZT sensor array)
Figure 6:
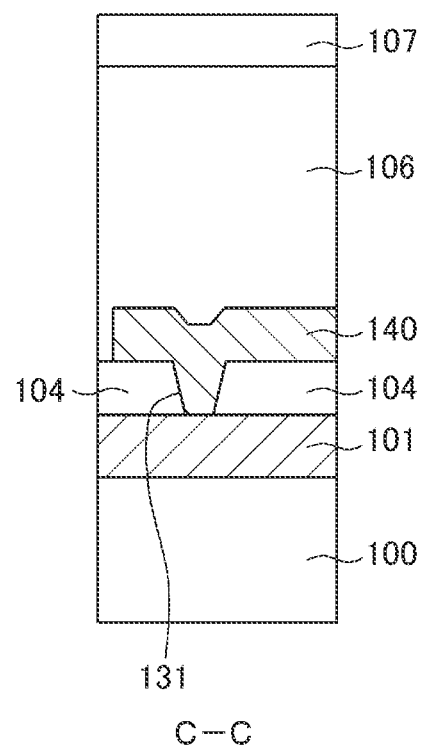
FIG. 6 is a cross-sectional view along the C-C line of FIG. 4.

An inorganic insulating film 104 formed of silicon oxide (SiO) film, silicon nitride (SiN) film, or the like is formed covering the upper electrode 103, the PZT film 102, and the lower electrode 101. The thickness of the inorganic insulating film 104 is, for example, about 200 nm. A through hole 130 is formed in the inorganic insulating film 104 to enable connection between the upper electrode 103 and the upper wiring 105. As shown in FIGS. 4 and 6, the lower electrode 101 is connected to the lower wiring 140 via the through hole 131.

The upper wiring 105 is formed of any one of titanium (Ti), a stacked film of titanium and aluminum (Ti/Al), tungsten (W), a molybdenum tungsten alloy (MoW), a stacked film of molybdenum and aluminum (Mo/Al), and a stacked film of molybdenum tungsten alloy and aluminum (MoW/Al). The thickness of the upper wiring 105 is, for example, several hundreds of nanometers. A thickness of the upper wiring 105 is larger than a thickness of the lower electrode 101 or the upper electrode 103.

Thus, PZT sensor is formed, but the thickness of the PZT sensor is as thick as 3 to 4 μm when the thickness of the electrode is included. It is difficult to form a display region on a PZT sensor as a result of the PZT sensor forming large irregularities. By forming a polyimide film 106 having a thickness of about 5 to 10 μm over the PZT sensor, it is possible to planarize the surface and laminate it with the PZT sensor to form a display region. The reason why the polyimide film 106 is set to 5 μm or more is to sufficiently planarize the surface of the polyimide film 106. In order to stably form the flat polyimide film 106, the thickness is set to 10 μm or less in consideration of process conditions. However, if the polyimide film 106 is divided into a plurality of processes, it may be made of a material having a thickness of 10 μm or more. Note that the thickness here is a maximum thickness at a position where the PZT sensor is not formed, and may be a thickness of 5 μm or less at a position where the PZT sensor is formed.

Since polyimide has excellent heat resistance, it can withstand the formation temperature of a semiconductor layer 108 forming a TFT (Thin Film Transistor) formed later. In the case of an organic EL display device, since the polyimide film 106 does not transmit light for image formation, it is also possible to use a non-transparent polyimide which is more excellent in heat resistance. Incidentally, when a polyimide film 106 of about 10 µm cannot be formed by one times, it can be formed in a plurality of times.

In FIG. 2, a barrier film 107 is formed on the planarized polyimide film 106. The barrier film 107 has, for example, a three layer structure of a silicon oxide (SiO) film, a silicon nitride (SiN) film, and a silicon oxide (SiO) film. The barrier film 107 serves to prevent moisture and the like from the polyimide film 106 from contaminating the semiconductor layer 108 for the TFT.

A semiconductor layer 108 constituting a TFT is formed on the barrier film 107. It is desirable to use an oxide semiconductor which can be formed at a relatively low temperature, but a low-temperature polysilicon (poly-Si) can also be used by using a heat-resistant polyimide. A channel region 1081 is formed in a portion of the semiconductor layer 108 corresponding to the gate electrode 110, and a source/drain region 1082 is formed on both sides of the channel region 1081.

A gate insulating film 109 is formed over the semiconductor layer 108, and a gate electrode 110 is formed thereon. The gate electrode 110 is formed in the same layer with the same material as a scanning line. An interlayer insulating film 111 is formed covering the gate electrode 110. A contact electrode 112 is formed on the interlayer insulating film 111. The contact electrode 112 is formed in the same layer as the video signal line. The contact electrode 112 is connected to one of the source/drain regions 1082 of the TFT via the through hole 133 formed in the interlayer insulating film 111 and the gate insulating film 109. The other of the source/drain regions 1082 of the TFT is connected to a video signal line formed on the interlayer insulating film 111 in a portion not shown.

At the same time as forming the through-hole 133, the through hole 132 is formed through the interlayer insulating film 111, the gate insulating film 109, the barrier film 107, and the polyimide film 106. Through this through hole 132, the upper wiring 105 of the PZT sensor is connected to the lead line 11. As a result, since the video signal line and the lead line 11 can be formed on the same layer, it is possible to form the sensor driving circuit and the display device driving circuit in the common driver IC 50. Further, the flexible wiring board 60 can be commonly formed and connected for the sensor and the display device.

In FIG. 2, an organic passivation film 113 is formed covering the interlayer insulating film 111, the contact electrode 112, and the like, and a reflective electrode 114 and an anode 115 for the organic EL film 117 are stacked thereon. Since the organic passivation film 113 serves as a planarization film, it is formed as thick as 2 to 3 µm. A through hole 134 is formed in an organic passivation film 113, and a contact electrode 112, a reflection electrode 114, and an anode 115 are connected. The reflective electrode 114 is made of an aluminum (Al) alloy, for example, and the anode 115 is made of ITO (Indium Tin Oxide), which is a transparent metal oxide conductive film.

An organic film for forming a bank 116 is formed covering the anode 115 and the organic passivation film 113. Holes are formed in the organic film at the portion where the pixel is formed, i.e., at the portion where the anode 115 is formed. A portion of the organic film other than holes becomes a bank 116.

An organic EL film 117 which is a light emitting layer is formed in a hole portion of an organic film. The organic EL film 117 is formed of a plurality of organic films. Since the organic EL film 117 is very thin, so-called step disconnection tends to occur, but the bank 116 prevents disconnection of the step.

The cathode 118 is formed of a transparent conductive film made of metal oxide or a metal thin film covering the organic EL film 117. A cathode 118 is formed on the entire display region in common to each pixel. Since the characteristics of the organic EL film 117 deteriorate due to impurities, particularly moisture, the protective film 119 prevents the influence of moisture from the outside. Typically, the protective film 119 has a stacked structure of an organic film and an inorganic film.

Figure 3:
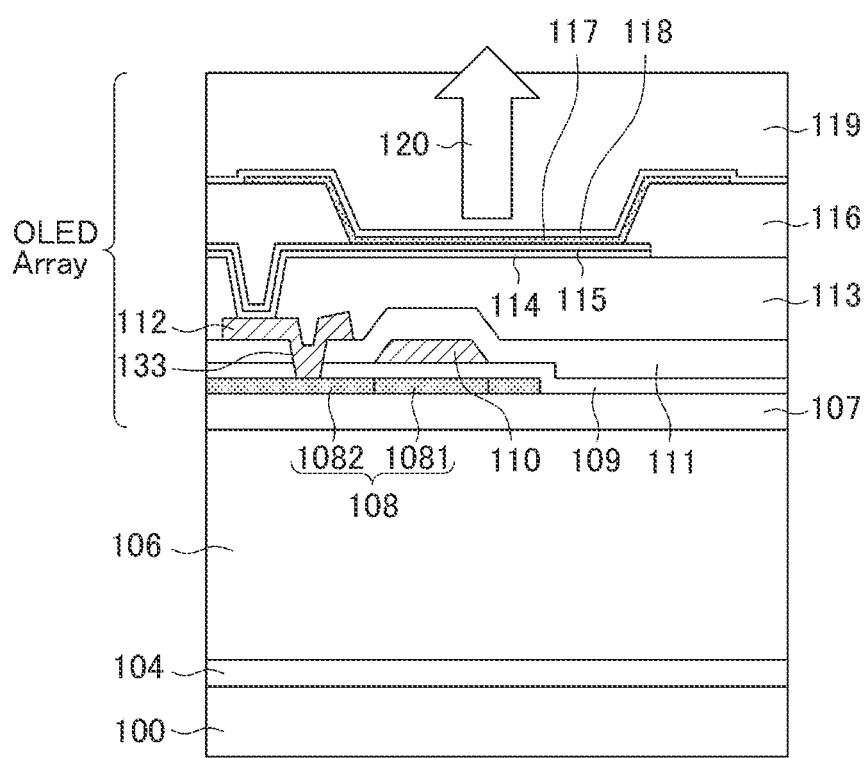
FIG. 3 is a cross sectional view of the display area in which a PZT sensor is not formed.

FIG. 3 is a cross-sectional view of the display region 20 of the portion where the HAPTIC sensor 10 is not present in FIG. 1. In FIG. 3, an inorganic insulating film 104 is formed on a substrate 100, and a polyimide film 106 as a planarizing film is formed on the inorganic insulating film 104 to a thickness of 5 to 10 µm. The insulating film 104 and the polyimide film 106 are the same as those described in FIG. 2.

As shown in FIG. 2 and FIG. 3, since the polyimide film 106 is formed thick, no irregularities exist between the portion where the PZT sensor is present and the portion where the PZT sensor is not present. Accordingly, it is possible to form a flat configuration in all of the display areas 20 and to form a uniform image.

FIG. 4 is a top view of the PZT sensor array in the HAPTIC sensor 10 of FIG. 1. In FIG. 4, the PZT film 102 extends in the x direction in common with each sensor common to the width y 2. The width of the PZT film 102 in the x direction is equal to the width of the display region 20 shown in FIG. 1. A portion where the lower electrode 101 and the upper electrode 103 are formed becomes an individual sensor element. The size of each sensor in the planar direction is defined by an area of the upper electrode 103 and x 1×y 1.

In FIG. 4, x1 is, for example, 10 mm, and y1 is, for example 10 mm. The lower electrode 101 is formed to be larger than the upper electrode 103 by about 10 µm in one side. In other words, d1 and d2 in FIG. 4 are 10 µm. A width of the PZT in y direction, which is formed slightly larger than the width of the upper electrode 103, is approximately 10.03 mm. In FIG. 4, d3 and d4 are, for example, 10 µm. An interval s1 between the lower electrodes 101 of each sensor is 100 µm. Thus, each sensor is aligned in the x-direction at a pitch of 1.14 mm.

The width x2 of the upper wiring 105 connected to the upper electrode 103 in the x direction is 100 to 500 µm, and the width x3 of the lower wiring 140 connected to the lower electrode 101 is 100 to 500 µm. The upper wiring 105 is connected to the upper electrode 103 by a through hole 130, and the lower wiring 140 is connected to the lower electrode 101 by a through hole 131.

Figure 5:
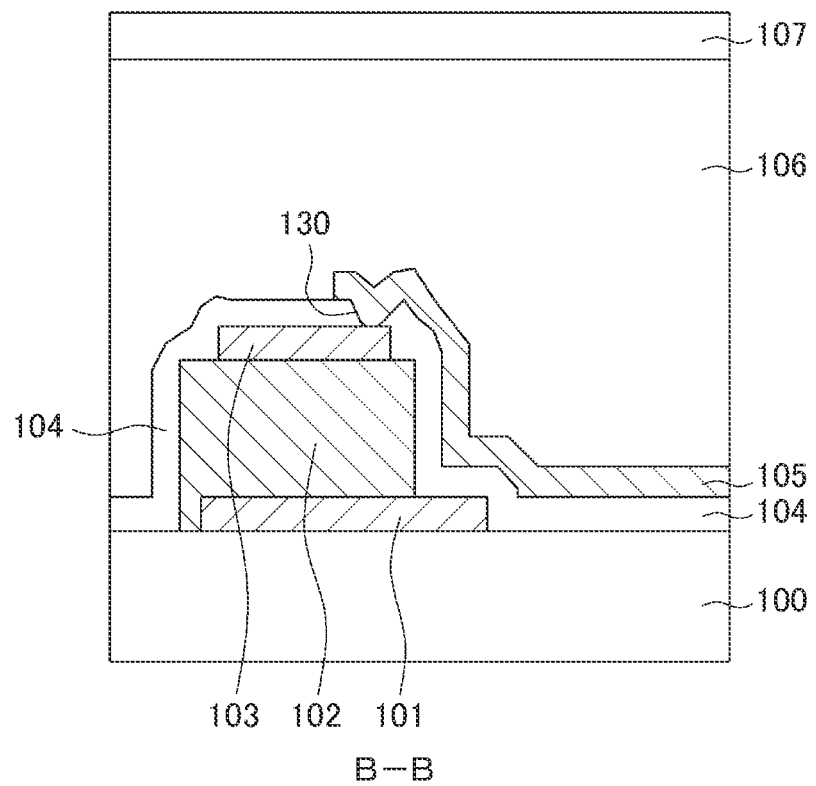
FIG. 5 is a cross-sectional view along the B-B line of FIG. 4.

FIG. 5 is a cross-sectional view taken along line B-B of FIG. 4 and is a cross-sectional view showing a relationship between the PZT sensor and the upper wiring 105. The configuration of FIG. 5 is similar to that described in FIG. 2. As shown in FIG. 5, the PZT sensor is covered by a thick polyimide film 106 of 5 to 10 µm, so that the upper surface of the polyimide film 106 becomes flat.

FIG. 6 is a cross-sectional view taken along line C-C of FIG. 4 and is a cross-sectional view showing the relationship between the PZT sensor and the lower wiring 101. In FIG. 6, a lower electrode 101 formed on a substrate 100 and a lower wiring 140 are connected to each other by a through hole 131 formed in an insulating film 104. Since the lower electrode 101 and the lower wiring 140 are covered with a thick polyimide film 106, the upper surface of the polyimide film 106 is flat, the same as shown in FIG. 5.

Figure 7:
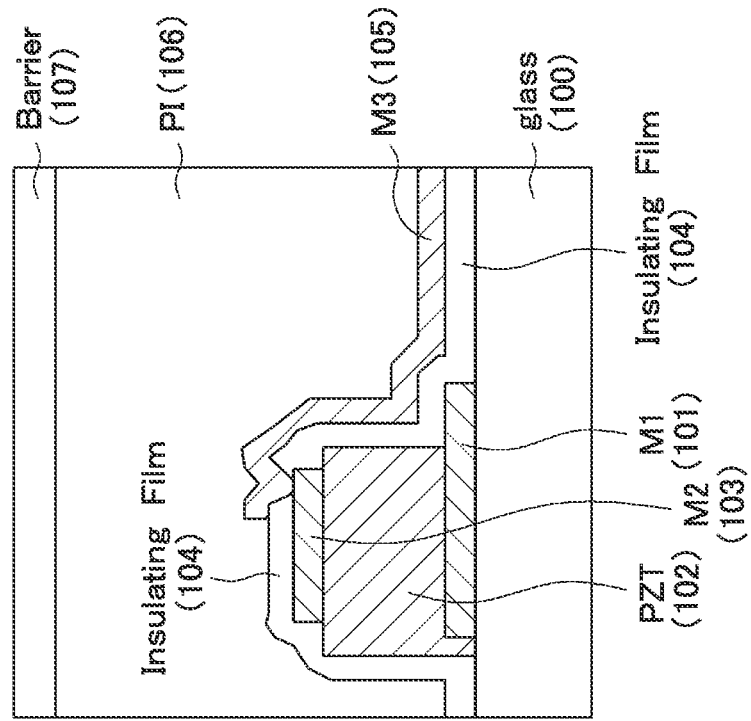
FIG. 7 is figures showing a processes to form the PZT sensor.

FIG. 7 shows a process for forming a PZT sensor portion. In FIG. 7, the left side is a process chart, and the right side is a cross-sectional view of a corresponding PZT sensor. The cross-sectional view of FIG. 7 is the same as that of FIG. 5, but for convenience, the lower electrode 101 is denoted by M1, the upper electrode 103 is denoted by M2, and the upper wiring 105 is denoted by M3. In a chart on the left side of FIG. 7, a lower electrode M1 is formed by sputtering. The lower electrode M1 is a stacked film of titanium (Ti) and platinum (Pt), but is formed continuously by sputtering. Thereafter, photolithography (PEP: photo engraving process) is performed on the lower electrode M1, and then the lower electrode M1 is patterned by dry etching.

Thereafter, PZT is formed, for example, by RF magnetron sputtering. Thereafter, PZT is subjected to photolithography (PZT/PEP), followed by patterning of PZT by dry etching or wet etching.

An upper electrode M2 is formed by sputtering, and then a photolithography (M2/PEP) is performed on the upper electrode M2. Thereafter, the upper electrode M2 is patterned by dry etching or wet etching.

An interlayer insulating film 104 which is an inorganic film is formed covering the lower electrode M1, the PZT, and the upper electrode M2. The interlayer insulating film 104 can be formed by CVD (Chemical Vapor deposition). Thereafter, photolithography (Contact/PEP) for forming a through hole 130 is performed in the interlayer insulating film 104 corresponding to the upper electrode M2, and thereafter, through hole 130 is formed by dry etching.

Thereafter, an upper wiring M3 is formed by sputtering, and photolithography is performed on the upper wiring M3 (M3/PEP). Thereafter, the upper wiring M3 is patterned by dry etching or wet etching.

A polyimide film PI is formed covering PZT sensor, to a thickness of 5 to 10 μm to planarize the surface. For example, the polyimide film PI is formed as follows. A raw material of polyimide containing a polyamic acid is applied by a slit coater or the like. As the material for the polyimide, for example, "Photoneece DL-1001-C" manufactured by Toray Industries, Ltd. can be used; and the specific component of the material is 40% of gamma butyrolactone (GBL), 40% of ethyl lactate (EL), and 12% of polyamic acid. Among them, polyamic acid is imidized to form polyimide. This material is applied, for example, in a thickness of 12.5 μm.

After this material is applied, prebaking is performed at 105° C. for 3 minutes, and then solidified and dried. At this time, the solvent scatters, and the thickness becomes about 6.5 μm. Thereafter, the polyimide is baked. The firing procedure is broadly divided into 4 steps. In the first step, the atmosphere in the furnace is replaced with nitrogen at room temperature so that oxygen becomes 10 ppm or less. The second step heats the substrate by a temperature gradient of 4° C./min. In a second step, a reaction of imidizing polyamic acid proceeds. Thereafter, in a third step, the polyimide molecules are oriented by keeping them at high temperature for about 30 minutes. Thereafter, in a fourth step, natural cooling is performed in a nitrogen atmosphere. The thickness of the polyimide after firing is about 5 μm.

As described above, since the thickness of the polyimide decreases during the drying and baking period, the thickness of the polyimide material coated with the polyimide material is much larger than the final thickness. Therefore, for example, when it is desired to set the polyimide film to a thickness of about 10 μm, it is also possible to form the polyimide film two times in overlapping. Thereafter, a barrier film (Barrier) is formed of a silicon oxide (SiO) film, a silicon nitride (SiN) film, or the like over the polyimide. A large amount of water is released from the polyimide. Further, even if moisture is released from the polyimide by baking or the like, if there is a time before the display region is formed, the polyimide absorbs moisture during this time, and then this moisture is released. By forming the barrier film 107 immediately after forming the polyimide film 106, it is possible to prevent the polyimide layer 106 from absorbing moisture from the outside.

Incidentally, since the adhesion between the polyimide film 106 and the glass substrate 100 is small, when the polyimide film 106 is directly formed on the glass substrate 100, the polyimide film 106 is easily peeled off. In the constitution of the present invention, a glass substrate 100 is covered by an inorganic film 104 as a silicon oxide (SiO) film, a silicon nitride (SiN) film or a stacked film of a silicon oxide (SiO) film and a silicon nitride (SiN) film, therefore, the adhesion between the polyimide film 106 and the glass substrate 100 is stable, and it is possible to realize a highly reliable display device having HAPTIC sensor.

Embodiment 2

In the configuration shown in FIG. 1, the upper electrode 103 or the lower electrode 101 of the PZT sensor is connected to the sensor lead line 11 or the like by forming the through hole 132 in the polyimide film 106 having a very large thickness. However, it may be difficult to form the through hole 132 in the polyimide film 106 having a thickness of 10 μm.

Figure 8:
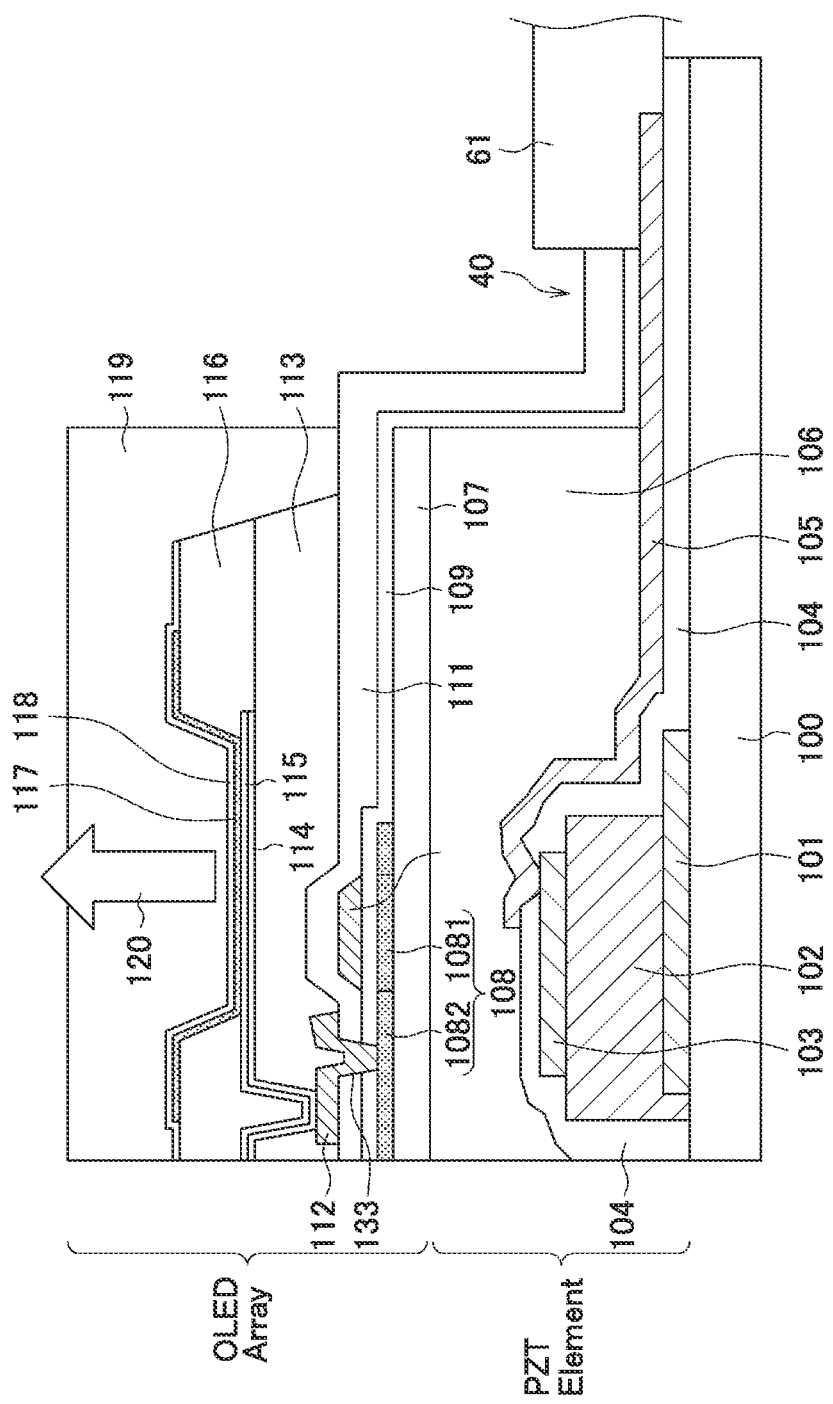
FIG. 8 is a cross-sectional view of embodiment 2.

In this case, it is also possible to pull out the lead line 11 for the PZT sensor and the lead line 21 for the display region 20 from different layers. FIG. 8 is a sectional view showing this state. In FIG. 8, a polyimide film 106 covering the upper wiring 105 of the PZT sensor is not formed in the terminal region 40. In other words, the through hole 132 in FIG. 2 is unnecessary. An upper wiring 105 of the PZT sensor is connected to a flexible wiring board 61 for a PZT sensor in a terminal region 40.

In FIG. 8, a lead line 21 for a display region is formed on a polyimide film 106. Therefore, the flexible wiring board 60 for the display area and the flexible wiring board 61 for the PZD sensor are individually connected to the terminal region 40. In the meantime, in FIG. 8, the driver IC 52 for the PZD sensor and the driver IC 51 for the display area are individually installed to a corresponding flexible wiring board.

Embodiment 3

There is a need for flexible display devices that do not use rigid substrates, such as glass. The present invention can also cope with such a configuration. That is, by forming a PZT sensor on a polyimide film, a flexible display device with an HAPTIC sensor can be realized.

Figure 9:
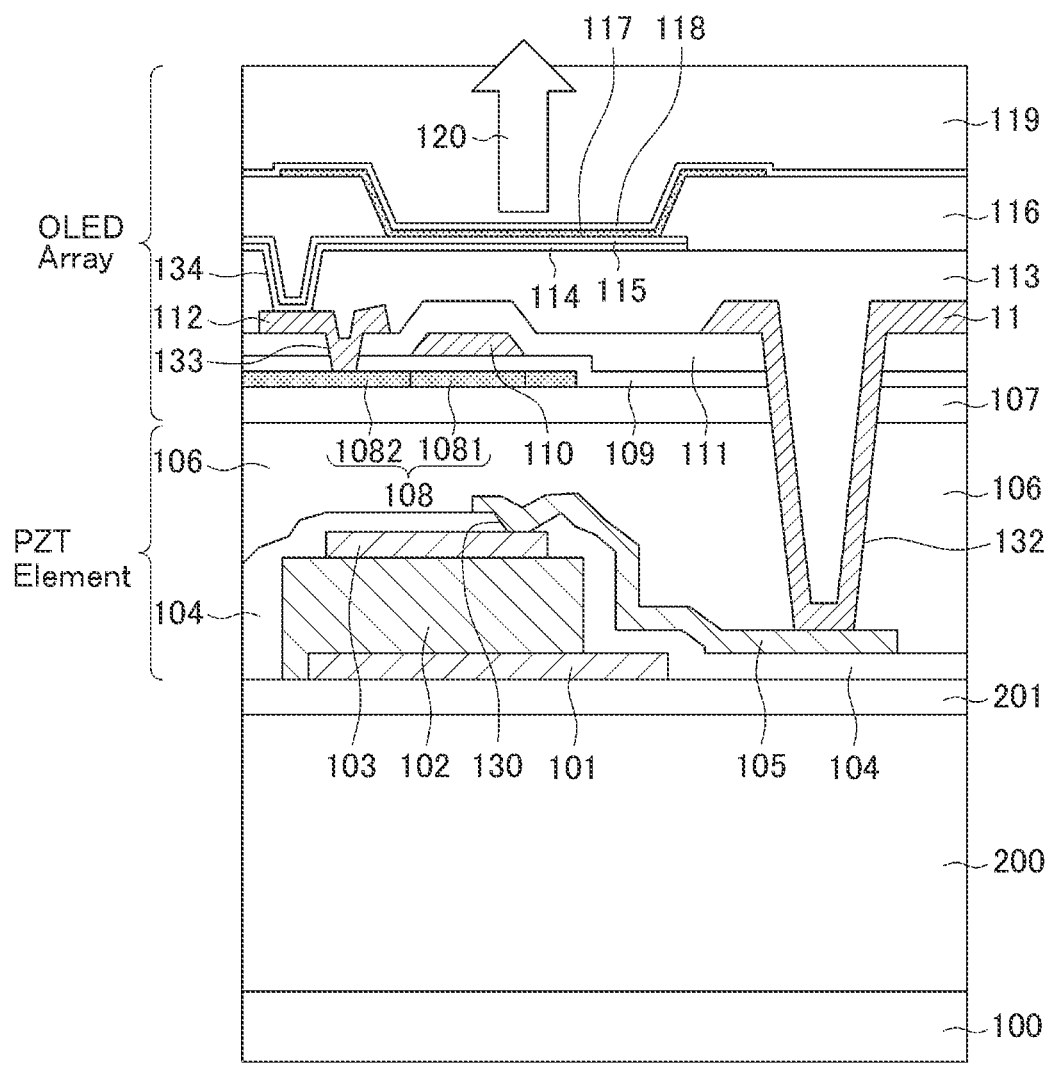
FIG. 9 is a cross-sectional view in the intermedium process in embodiment 3.
Figure 10:
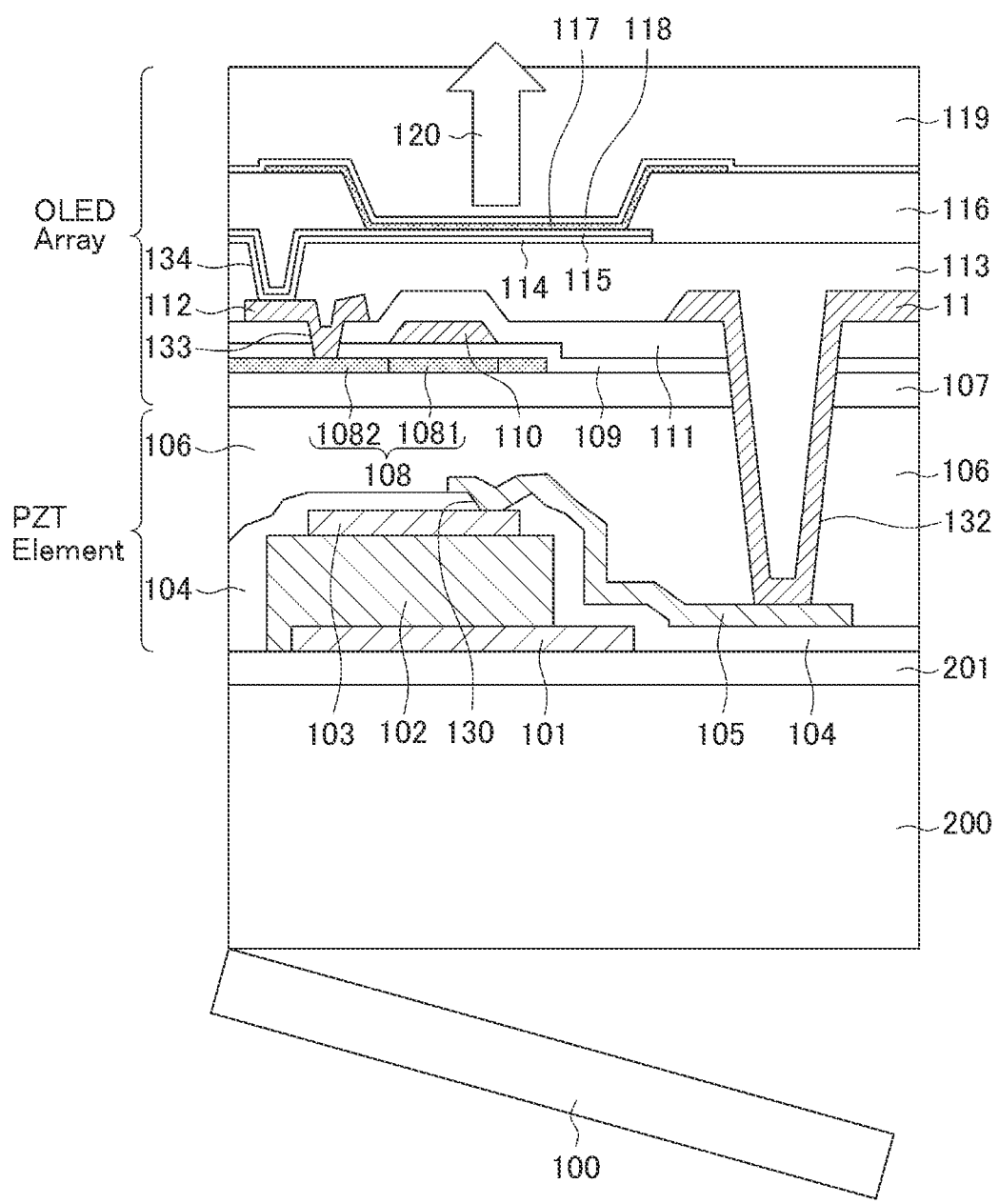
FIG. 10 is a cross-sectional view in the intermedium process in embodiment 3 following the process of FIG. 9.

FIGS. 9 and 10 are cross-sectional views showing a process for realizing such a display device. In FIG. 9, a second polyimide film 200 is formed on a glass substrate 100. The second polyimide film 200 substitutes a glass substrate and serves as a flexible substrate. The second polyimide film 200 can be formed on a glass substrate 100, which is to be removed later, by a method similar to the formation of the polyimide film 106 described in Embodiment 1. Thereafter, a second barrier film 201 is formed of a silicon oxide (SiO) film and a silicon nitride (SiN) film. The second barrier film 201 can have the same structure as that of the barrier film 107 described in Embodiment 1. The layer above the second barrier film 201 is the same as that described in Embodiment 1.

FIG. 10 is a cross-sectional view showing a state in which the glass substrate 100 is peeled off from the configuration of FIG. 9. The glass substrate 100 can be peeled off by laser ablation, for example, by irradiating with a laser beam a boundary between the glass substrate 100 and the second polyimide film 200. Since adhesion between the polyimide film 200 and the glass substrate 100 is inherently weak, the glass substrate 100 can be relatively easily peeled off from the polyimide film 200.

In the configuration shown in FIG. 10, since two polyimide films are formed, there is no need to extremely increase the thickness of each polyimide film, so that a process load is small. In addition, since a barrier film formed of a silicon oxide (SiO) film and a silicon nitride (SiN) film is formed in two layers, it is possible to reduce the influence of moisture or the like on the organic EL film 117 and the like from the outside. Accordingly, it is possible to realize a highly reliable flexible display device having a HAPTIC sensor. If there is no problem in terms of reliability, the second barrier film 201 may be omitted, and a PZT sensor may be directly formed on the second polyimide film 200.

While the above description has been made of an organic EL display device as a display device, the configuration of the present invention can be used in other display devices such as a liquid crystal display device and a micro LED display device. Further, the present invention is applicable to other semiconductor devices used in combination with PZT sensors. In this case, the display areas in Embodiments 1 to 3 can be referred to as active areas.

Further, a material of a ferroelectric material other than PZT is also present as a piezoelectric element or a pyroelectric element; the present invention can be similarly applied to a sensor using these materials.

What is claimed is:

1. A semiconductor device having a PZT (lead zirconate titanate ($PbZrTiO_3$)) sensor comprising:
   the PZT sensor including a lower electrode formed on a glass substrate, a PZT, an upper electrode, a first inorganic insulating film covering the upper electrode, and an upper wiring formed on the first inorganic insulating film and connected to the upper electrode through a first through-hole formed in the first inorganic insulating film,
   wherein a polyimide film is formed over the PZT sensor,
   a plurality of TFTs are formed on the polyimide film,
   a thickness of the polyimide film is 5 µm to 10 µm,
   the first inorganic insulating film is formed in contact with the glass substrate, and
   the first inorganic insulating film contacts the polyimide film.

2. The semiconductor device according to claim 1, wherein the plurality of the TFTs are switching TFTs used in a display device.

3. The semiconductor device according to claim 1, wherein a second inorganic insulating film is formed on the polyimide film, and
   the plurality of the TFTs are formed on the second inorganic insulating film.

4. The semiconductor device according to claim 1, wherein a second through hole is formed in the polyimide film, the upper electrode is connected to a lead out wiring through the second through hole, and
   the lead out wiring is formed on the same layer as wirings which connect with the plurality of TFTs.

5. A semiconductor device having a PZT (lead zirconate titanate ($PbZrTiO_3$)) sensor comprising:
   the PZT sensor including a lower electrode formed on a first polyimide substrate, a PZT, an upper electrode, a first inorganic insulating film covering the upper electrode, and an upper wiring formed on the first inorganic insulating film and connected to the upper electrode through a first through-hole formed in the first inorganic insulating film,
   wherein a second polyimide film is formed over the PZT sensor,
   a plurality of TFTs are formed on the polyimide film,
   a thickness of the second polyimide film is 5 µm to 10 µm, and
   the first inorganic insulating film is formed in contact with the first polyimide substrate and the second polyimide film.

6. The semiconductor device according to claim 5, wherein a thickness of the first polyimide substrate is 5 µm or more.

7. A semiconductor device having a PZT (lead zirconate titanate ($PbZrTiO_3$)) sensor comprising:
   the PZT sensor including a lower electrode formed on a first inorganic insulating film, which covers a first polyimide film,
   a PZT,
   an upper electrode,
   a second inorganic insulating film covering the upper electrode, and
   an upper wiring, formed on the second inorganic insulating film, contacting with the upper electrode via a first through hole formed in the second inorganic insulating film
   wherein a second polyimide film is formed on the PZT sensor,
   a plurality of TFTs are formed on the second polyimide film,
   a thickness of the second polyimide film is 5 µm to 10 µm, and
   the second inorganic insulating film is formed in contact with the first inorganic insulating film and the second polyimide film.

8. The semiconductor device according to claim 7, wherein a thickness of the first polyimide film is 5 µm or more.

* * * * *